United States Patent
Fulford, Jr. et al.

[11] Patent Number: 5,950,091
[45] Date of Patent: Sep. 7, 1999

[54] METHOD OF MAKING A POLYSILICON GATE CONDUCTOR OF AN INTEGRATED CIRCUIT FORMED AS A SIDEWALL SPACER ON A SACRIFICIAL MATERIAL

[75] Inventors: H. Jim Fulford, Jr., Austin; Mark I. Gardner, Cedar Creek; Derick J. Wristers, Austin, all of Tex.

[73] Assignee: Advanced Micro Devices, Inc.

[21] Appl. No.: 08/761,128

[22] Filed: Dec. 6, 1996

[51] Int. Cl.⁶ ................................. H01L 21/336
[52] U.S. Cl. .................. 438/303; 438/304; 438/305; 438/306; 438/307; 438/585; 438/586
[58] Field of Search .................... 438/303, 304, 438/305, 306, 307, 585, 586

[56] References Cited

U.S. PATENT DOCUMENTS

| | | | |
|---|---|---|---|
| 4,359,816 | 11/1982 | Abbas et al. | 438/303 |
| 4,400,865 | 8/1983 | Goth et al. | 438/303 |
| 4,419,809 | 12/1983 | Riseman et al. | 438/303 |
| 4,442,589 | 4/1984 | Doo et al. | |
| 4,460,413 | 7/1984 | Hirata et al. | |
| 4,597,827 | 7/1986 | Nishitanit et al. | |
| 5,041,895 | 8/1991 | Contiero et al. | |
| 5,202,272 | 4/1993 | Hsieh et al. | |
| 5,283,449 | 2/1994 | Ooka . | |
| 5,373,476 | 12/1994 | Jeon . | |
| 5,445,107 | 8/1995 | Roth et al. | |
| 5,468,666 | 11/1995 | Chapman . | |
| 5,576,570 | 11/1996 | Ohsawa et al. | |
| 5,679,971 | 10/1997 | Tamba et al. | |

FOREIGN PATENT DOCUMENTS

| | | |
|---|---|---|
| 0 186 058 | 7/1986 | European Pat. Off. . |
| 0 402 296 | 12/1990 | European Pat. Off. . |
| 0 675 544 A1 | 10/1995 | European Pat. Off. . |
| 60-66861 | 4/1985 | Japan . |

OTHER PUBLICATIONS

Patent Abstracts of Japan 58175364 published Apr. 17, 1985, Toshiharu.
XP000671026 IBM Technical Disclosure, vol. 30, No. 3, Aug. 1987, pp. 1136–1137.
XP000120044 IBM Technical Disclosure, vol. 33, No. 1A, Jun. 1990, pp. 75–77.

*Primary Examiner*—John F. Niebling
*Assistant Examiner*—Lynne A. Gurly
*Attorney, Agent, or Firm*—Kevin L. Daffer; Conley, Rose & Tayon

[57] ABSTRACT

A gate conductor structure and method for forming the structure are provided whereby the overall gate length can be made with less susceptibility to lithography variations. The gate conductor is produced by defining a sidewall surface region and then forming the gate conductor material on that sidewall surface a closely controlled, defined lateral distance therefrom. The gate conductor length is therefore dependent primarily upon deposition technology rather than both deposition and lithography. Deposition can be controlled at the defined sidewall surface more closely than mask alignment, thin film development and etching processes of conventional designs. The gate conductor is formed from the sidewall surface such that the sidewall surface demonstrates a greater likelihood of forming a thicker sidewall spacer on one surface of the gate conductor than the opposing gate conductor surface. Accordingly, the gate conductor demonstrates asymmetrical sidewall spacer formation and the benefits of a drain area formed a greater distance from the channel than a source area.

8 Claims, 6 Drawing Sheets

METHOD OF MAKING A POLYSILICON GATE CONDUCTOR OF AN INTEGRATED CIRCUIT FORMED AS A SIDEWALL SPACER ON A SACRIFICIAL MATERIAL

BACKGROUND OF THE INVENTION

1. Field of the Invention

This invention relates to semiconductor processing and, more particularly, to a more accurate method for forming an ultra-small gate conductor of an MOS transistor.

2. Description of the Related Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal annealer ("RTA"). A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

Conventional lithography used to pattern a gate conductor suffers many drawbacks. For example, selective exposure is highly dependent upon accurately placing light on the light-sensitive material. Furthermore, the light-sensitive material must consistently respond to the light with fine-line resolution. Any elevational disparity on which the polysilicon resides will result in slight changes in the point at which light impinges on the light-sensitive material. This results in a variation of the polymerized/non-polymerized boundary.

It would be advantageous to form a gate conductor without having to rely upon conventional patterning techniques. The impetus behind wanting to change gate formation methodology is principally driven from the smaller gate sizes of modern day integrated circuits. As gate lengths and widths become smaller to accommodate higher density circuits, it is necessary that the relatively small gate conductors be accurately produced with minimal misalignment or size variation. Any changes in the placement and geometry of a gate conductor can have negative performance effects on the ensuing MOS transistor.

An n-channel transistor, or NMOS transistor, must in most instances be fabricated different from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions becomes less than the physical channel length and is often referred to as the effective channel length ("Leff"). In high density designs, not only does the physical channel length become small so too must the Leff. As Leff decreases below approximately $1.0\,\mu m$, for example, a problem known as short channel effects ("SCE") becomes predominant.

Generally speaking, SCE impacts device operation by, inter alia, reducing device threshold voltages and increasing sub-threshold currents. As Leff becomes small enough, the depletion regions associated with the junction areas may extend toward one another and substantially occupy the channel area. Hence, some of the channel will be partially depleted without any influence of gate voltage. Even at times when the gate voltage is below the threshold amount, current between the junctions (often referred to as subthreshold current) nonetheless exists for transistors having a relatively short Leff.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em") occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., $0.8\,\mu m$.

Unless modifications are made to the process in which relatively small transistors are formed, problems with subthreshold current and threshold shift resulting from SCE and HCE will remain. To overcome these problems, alternative drain structures such as double-diffused drains ("DDD") and lightly doped drains ("LDD") must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

A properly defined LDD implant area must be one which minimizes HCE but not at the expense of excessive source/drain resistance. The addition of an LDD implant adjacent the channel unfortunately adds resistance to the source/drain path. This added resistance, generally known as parasitic resistance, can reduce the overall speed of the transistor. Thus, proper LDD design must take into account the need for minimizing parasitic resistance while at the same time attenuating Em at the drain-side of the channel. Further, proper LDD design requires that the injection position associated with the maximum electric field, Em, be located under the gate conductor edge, preferably well below the silicon surface.

It is therefore desirable to produce a gate conductor which is extremely small in channel length. The small gate conductor must be one which is formed outside of the normal lithography limitations. In order to accurately produce a small gate conductor, a process must be used which avoids the limitations of lithographic exposure, develop and etch cycles applied for defining conventional gate conductors upon a gate dielectric. In order for a transistor which employs a relatively small gate conductor to achieve commercial success, improvements must be undertaken not only to the lithography procedure but also to the LDD structure itself. As Leff decreases commensurate with gate conductor size, LDD implants must be carefully controlled so as not to encroach into the relatively short channel while at the same time source/drain implants must be sufficiently concentrated to minimize HCE. Still further, the spacing of the source/drain implants must not be excessive, especially at the source-side of the channel, where parasitic resistance is most problematic.

SUMMARY OF THE INVENTION

The problems outlined above are in large part solved by an improved transistor configuration hereof. The transistor can be either a PMOS or NMOS transistor. The transistor is classified as one having a gate conductor formed outside of the conventional lithography process. Instead of depositing a gate conductor material across an entire planar surface, the present process employs a gate conductor material formed so that it is bounded on one lateral surface against a sacrificial material. The bounded gate conductor can be formed by depositing a layer of polysilicon across and adjacent to the sacrificial material. The layer is then partially removed using an anisotropic etch technique, leaving a gate conductor adjacent the sacrificial material. Height of the sacrificial material and the deposition thickness of the gate conductor material will define the entire gate conductor geometry. Following formation of the gate conductor, spacers can be formed on opposed lateral surfaces of the gate conductor. The spacer on one lateral surface can be of dissimilar thickness than the spacer on the opposing lateral surface. The transistor hereof is thereby classified as an asymmetrical transistor, wherein the drain-side spacer can be made thicker than the source-side spacer. Since the spacers define source/drain implant alignment, dissimilar spacer thicknesses will cause the drain implant area to be spaced further away from the gate conductor than that of the source implant area.

The present process utilizes a sacrificial material which is patterned at a specific location upon a dielectric-covered semiconductor substrate. The dielectric material is sacrificial in that it is later removed from the semiconductor topography. The sacrificial material includes a pair of opposed sidewall surfaces. Those sidewall surfaces serve as receptors against which a gate conductor is later formed. The spacers formed on the sidewall surfaces are defined as having a thickness which laterally extends from each of the opposed sidewall surfaces. That thickness is used to align source/drain implant areas within the semiconductor substrate after the sacrificial material is removed. The source/drain implant areas of the junctions are spaced from the gate conductor, or more specifically, the channel. Absent the spacers, the LDD implant areas of the junctions exist adjacent the gate conductor or channel.

The gate conductor is formed by preferably depositing a polysilicon material across the upper and sidewall surfaces of the patterned sacrificial material. An anisotropic etch, according to a preferred embodiment comprising an ion-directed or ion-assisted plasma etch, is then used to remove the polysilicon horizontal surfaces faster than the polysilicon vertical surfaces. After the horizontal surfaces are completely removed from the sacrificial material and from the semiconductor topography a spaced distance from the sacrificial material, what remains is a gate conductor on the sidewall surfaces immediately adjacent the substantially vertical sidewall surfaces of the sacrificial material. The height of the gate conductor is dependent on the height of the sacrificial material, whereas the thickness (or width) of the gate conductor measured from the sacrificial material sidewall surfaces is dependent on the polysilicon deposition thickness as well as the anisotropic etch composition and duration. If the deposition thickness is quite large and the etch is minimal, the gate conductor can have a width which is relatively large. That width, which defines the channel length or Leff is commensurately large.

Of prime importance is the avoidance in using conventional lithography to define gate width. Instead, the present process uses lithography only to define an edge (i.e., sacrificial material sidewall surface) of the gate conductor. Deposition and blanket anisotropic etchback is thereafter used to define the other edge of the gate conductor. Accordingly, the present gate conductor is configured using a combination of lithography and deposition techniques. The deposition can be performed at a slow rate so as to more carefully control, with fine-line resolution, the overall width of the ensuing gate conductor.

Broadly speaking, the present invention contemplates a transistor. The transistor comprises a sacrificial material having a pair of opposed sidewall surfaces. A gate dielectric is defined upon a semiconductor substrate immediately adjacent a pair of opposed sidewall surfaces. A gate conductor is then configured upon the gate dielectric immediately adjacent at least one of the pair of opposed side wall surfaces. Implant areas are formed within the semiconductor topography after removal of the sacrificial material. The implant areas are aligned with a pair of opposing edges of the gate conductor.

The present invention further contemplates a method for forming a transistor. The method comprises patterning a sacrificial material having opposed sidewall surfaces upon a dielectric-covered semiconductor substrate. A gate conductor is then formed upon only the sidewall surfaces, leaving the dielectric-covered semiconductor substrate substantially exposed as well as the sacrificial material upper surface entirely exposed. A portion of the gate conductor and the entire sacrificial material is then removed. Dopants are then deposited at a first concentration immediately adjacent the gate conductor to form lightly doped drain areas within the semiconductor substrate. Dopants of a second concentration are then deposited a spaced distance from the gate conductor to form source and drain areas within the semiconductor substrate. The source and drain areas are spaced from one another by the lightly doped drain areas and a channel region. The channel region, overlying gate conductor and adjacent implant regions form a transistor having interconnect forwarded as contacts to the implant regions or, more specifically, the source/drain areas of the implant regions.

The present invention yet further contemplates a method for forming an integrated circuit. The method includes patterning a sacrificial material upon a dielectric-covered semiconductor substrate. The sacrificial material is partially defined between opposed first and second sidewall surfaces. A first gate conductor is then patterned exclusively upon the first sidewall surface simultaneously with a second gate conductor patterned exclusively upon the second sidewall surface. The first and second gate conductors are spaced laterally from one another across the semiconductor substrate. A plurality of junction areas are then implanted within the semiconductor substrate immediately adjacent the first and second gate conductors. One of the junction areas resides a contiguous distance between the first and second gate conductors. Thus, the contiguous distance comprises a conductive area which couples in series a source-drain path formed by the first gate conductor to a source-drain path formed by the second gate conductor.

BRIEF DESCRIPTION OF THE DRAWINGS

Other objects and advantages of the invention will become apparent upon reading the following detailed description and upon reference to the accompanying drawings in which.

Figure 1:
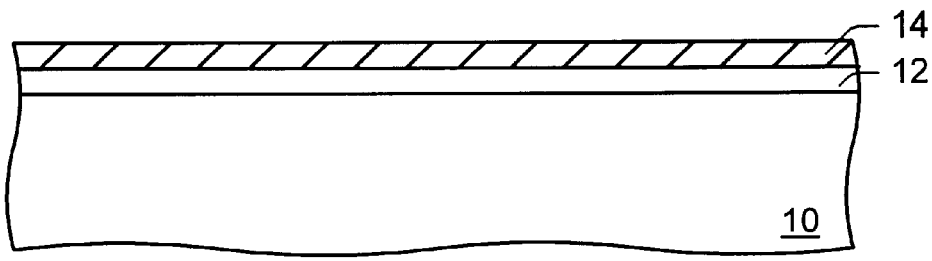
FIG. 1 is a partial cross-sectional view of the semiconductor substrate, wherein layers of oxide and nitride are deposited according to an initial processing step.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a partial cross-sectional view of a semiconductor substrate 10, preferably made of single crystalline silicon. Deposited entirely across substrate 10 is a dielectric 12. The dielectric is either deposited or grown from a heated, oxygen bearing source. Deposited upon oxide 12 is a nitride, typically referred to as silicon nitride 14. Oxide 12 and nitride 14 can, if desired, be used as a protective layer on silicon mesas arranged between shallow trench isolation regions. The protection afforded by nitride 14 and oxide 12 ensures the integrity of the substrate upper surface (active areas) is retained during the shallow trench isolation process. Alternatively, protection afforded by nitride 14 and oxide 12 can be used in the LOCOS isolation technique whereby oxide is grown in regions removed of nitride 14 and oxide 12. In either instance, nitride 14 and oxide 12 can be used at the front-end processing of a silicon substrate 10 employing active regions and isolation regions interspersed thereon.

Figure 2:
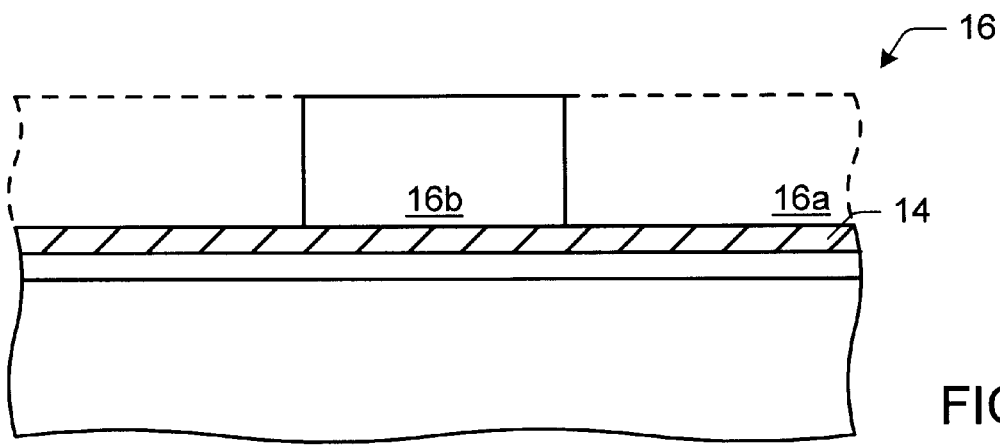
FIG. 2 is a partial cross-sectional view of the semiconductor substrate, wherein a sacrificial material is patterned upon a select region of the semiconductor topography according to a processing step subsequent to FIG. 1.

Referring to FIG. 2, a sacrificial material 16 is deposited entirely across nitride 14. Portions of material 16 are removed, as indicated by reference numeral 16a. The retained portions 16b exist only above isolated regions of nitride 14. Patterning sacrificial material 16b is achieved using well-known lithography techniques. Sacrificial material 16 may be a dielectric, a suitable dielectric being a chemical vapor deposited oxide.

Figure 3:
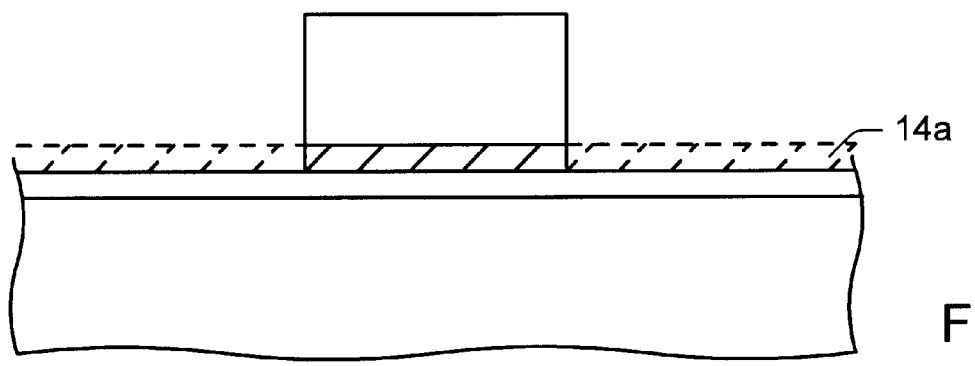
FIG. 3 is a partial cross-sectional view of the semiconductor substrate, wherein the exposed nitride is removed according to a processing step subsequent to FIG. 2.

FIG. 3 illustrates removal of nitride 14 in regions where nitride 14 is exposed. An etchant is chosen which is selective to removing nitride but not sacrificial material 16b. If sacrificial material 16b is an oxide, for example, the etchant is preferably a wet etchant chosen from the group known to primarily remove nitride in lieu of oxide. The removed nitride is shown in FIG. 3 as reference numeral 14a.

Figure 4:
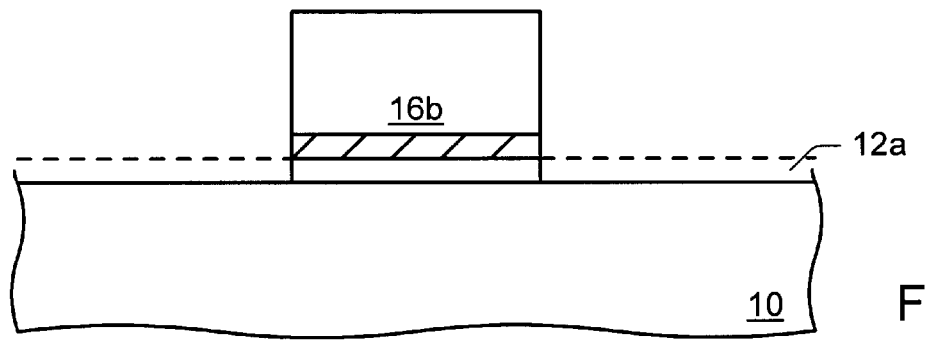
FIG. 4 is a partial cross-sectional view of the semiconductor substrate, wherein the exposed oxide is removed according to a processing step subsequent to FIG. 3.
Figure 5:
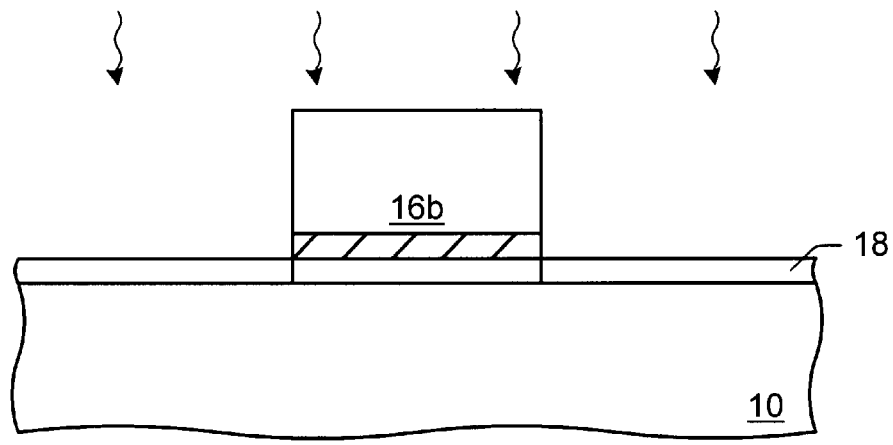
FIG. 5 is a partial cross-sectional view of the semiconductor substrate, wherein a thermally grown gate dielectric is formed on exposed silicon substrate according to a processing step subsequent to FIG. 4.

FIG. 4 illustrates removal of oxide 12 in regions where oxide is exposed. Again, the etchant is chosen to remove oxide in lieu of underlying silicon substrate 10. The removed oxide is shown in FIG. 4 as reference numeral 12a. If sacrificial material 16b is an oxide, it is appreciated that the etchant which removes oxide 12a will also partially remove oxide 16b. Given the disparity in thicknesses, some of material 16b, however, will remain. That which remains will serve to block an oxygen-bearing ambient as shown in FIG. 5. FIG. 5 illustrates exposure of substrate 10 in regions not having material 16b thereupon. The exposed substrate 10 incurs growth of thermal oxide 18. The concept of forming thermal oxide, or growing oxide is generally well known given a silicon material and the exposure of that material to elevated temperatures and an oxygen environment.

Figure 6:
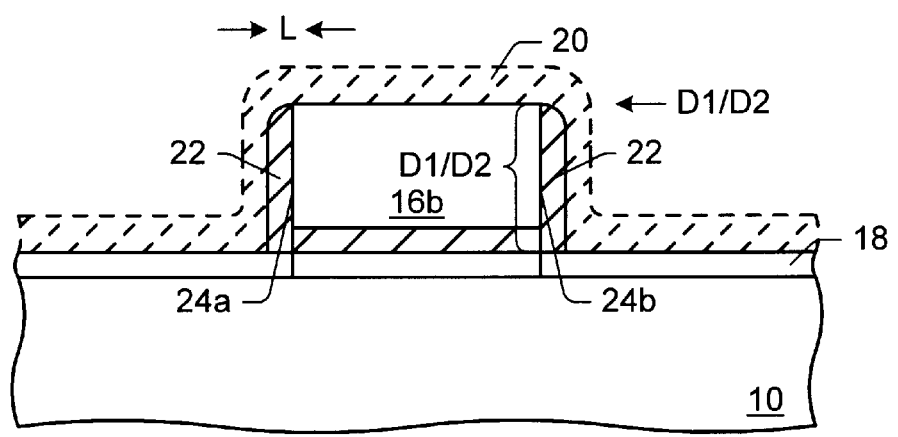
FIG. 6 is a partial cross-sectional view of the semiconductor substrate, wherein a gate conductor is formed on the gate dielectric adjacent to only the sidewall surfaces of the sacrificial material according to a processing step subsequent to FIG. 5.

FIG. 6 illustrates a material deposited across the resulting topography (i.e., across oxide 18 as well as sacrificial material 16b. The deposited material is preferably polycrystalline silicon which can be rendered conductive by a subsequent implanting step. Deposited polysilicon material 20 is then anisotropically removed to form gate conductors 22. Anisotropic etching is defined as a plasma etch employing both physical and chemical removal mechanisms. Ions are bombarded at an angle substantially perpendicular to substrate 10 upper surface. This causes substantially horizontal surfaces to be removed faster than substantially vertical surfaces. Accordingly, anisotropic etching removes a portion of material 20, that portion having substantially horizontal surfaces existing over materials 16b and oxide 18. The only regions of material 20 which remain are those regions near substantially vertical surfaces (i.e., regions adjacent sidewall surfaces 24a and 24b of sacrificial material 16b). Gate conductors 22 extend upward to a height D2 substantially equal to the height D1 of sidewall surfaces 24. Accordingly, the upper surface of sacrificial material 16b acts as an etch stop against subsequent vertical removal. The thickness herein defined as length L, is determined by the deposition thickness of polysilicon 20, the height D1 of material 16b and the etch duration needed to removal material 20 from the upper surface of sacrificial material 16b as well as upper surfaces of oxide 18 spaced from sacrificial material 16b.

Figure 7:
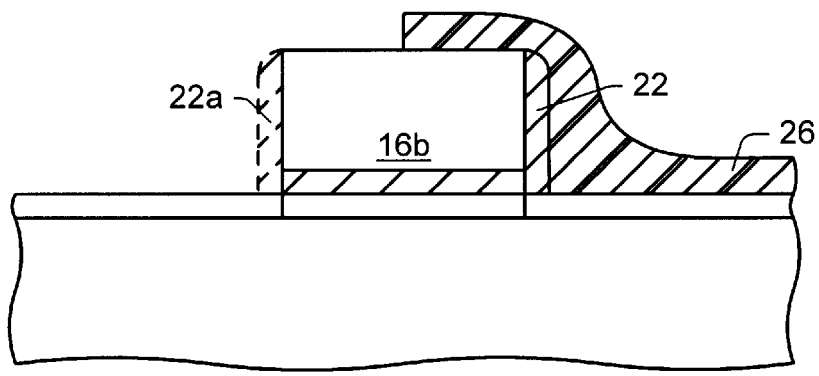
FIG. 7 is a partial cross-sectional view of the semiconductor substrate, wherein the gate conductor adjacent a portion of the sidewall surface is removed according to a processing step subsequent to FIG. 4.

FIG. 7 illustrates deposition and selective removal of a light-sensitive (photoresist) layer 26. Photoresist layer 26 is patterned using well-known lithography techniques to expose a portion of sacrificial material 16b and, more importantly, a portion of gate conductor 22a. The exposed gate conductor 22a can then be removed using, for example, highly selective wet etch techniques. Photoresist 26 serves to mask etch access to the remaining gate conductor 22.

Figure 8:
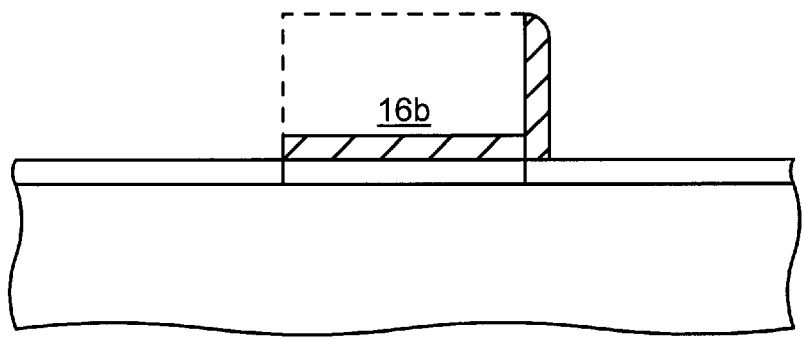
FIG. 8 is a partial cross-sectional view of the semiconductor substrate, wherein the sacrificial material is removed according to a processing step subsequent to FIG. 7.
Figure 9:
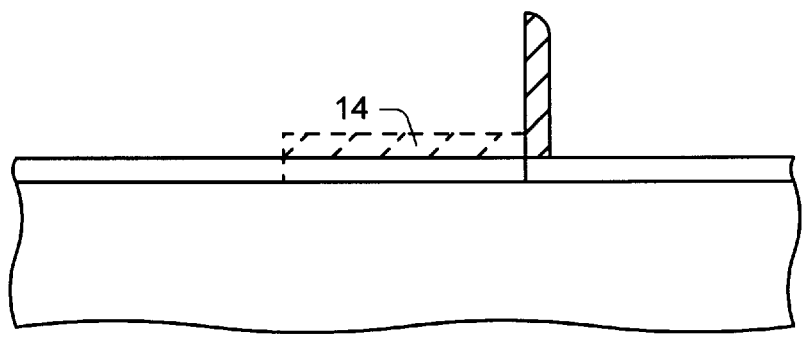
FIG. 9 is a partial cross-sectional view of the semiconductor substrate, wherein the nitride underlying the sacrificial material is removed according to a processing step subsequent to FIG. 8.
Figure 10:
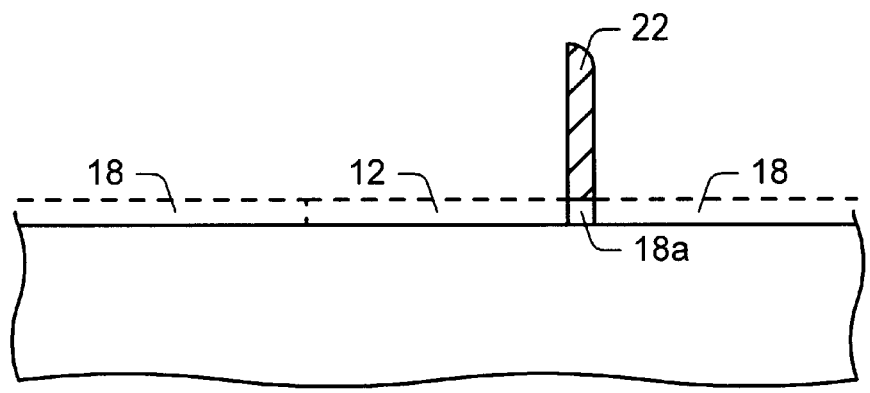
FIG. 10 is a partial cross-sectional view of the semiconductor substrate, wherein the exposed oxide across the semiconductor substrate is removed according to a processing step subsequent to FIG. 9.

FIG. 8 illustrates removal of photoresist 26 in its entirety. Thereafter sacrificial material 16b is removed using, for example, a wet etch technique. FIG. 9 depicts a subsequent processing step whereby the exposed nitride 14 which was previously underneath sacrificial material 16b is removed. FIG. 10 illustrates a processing step subsequent to FIG. 9, whereby the entire oxide, thermally grown or deposited oxide 12 and 18, are removed except for the oxide 18a underlying the retained gate conductor 22. FIG. 10 thereby depicts a polysilicon gate conductor 22 overlying a thermally grown potion 18a of thermally grown oxide layer 18.

Figure 11:
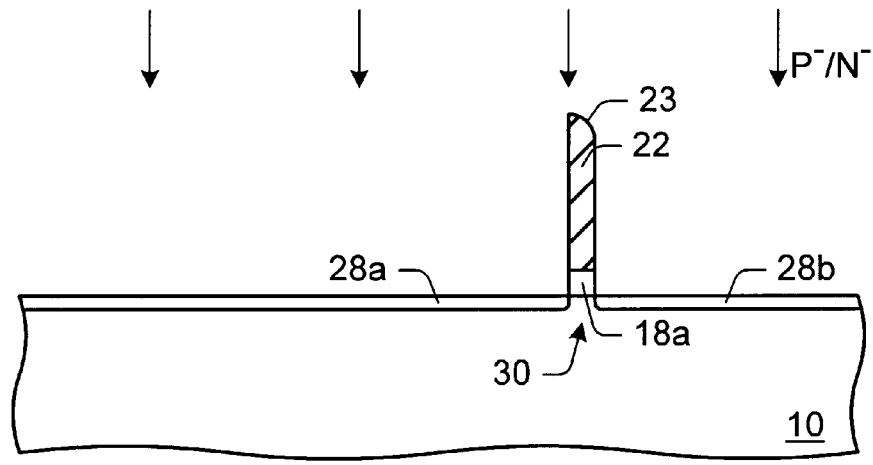
FIG. 11 is a partial cross-sectional view of the semiconductor substrate, wherein an LDD implant is forwarded into the semiconductor substrate immediately adjacent the channel underlying the gate conductor according to a processing step subsequent to FIG. 10.

FIG. 11 depicts a processing step subsequent to FIG. 10, wherein gate conductor 22 serves as an implant mask according to the well-known self-aligned process. Gate conductor 22 masks implant of either a p-type or n-type species from entering substrate 10. In regions where gate conductor 22 does not exists, the implant species is implanted at a first depth and first concentration level. If the species is p-type, then preferably the dopant comprises boron, and if the species is n-type then the dopant preferably comprises phosphorous. The first dopant concentration and depth is preferably chosen such that the regions being implanted form lightly doped drain (LDD) areas 28a and 28b. LDD area 28a represents the drain side of channel 30, and LDD area 28b represents the source side of channel 30.

Gate conductor 22, produced as a result of the processing steps up to FIG. 11, includes opposing lateral surfaces. One of those surfaces is somewhat planar and extends substantially perpendicular to substrate 10 upper surface. The other surface is purposefully arcuate, as shown by reference numeral 23. Arcuate surface 23 extends from the apex of the planar surface. The flat, substantially perpendicular surface provides an area which, when a planarization layer is deposited thereon, has a greater propensity to accumulate the deposited layer than the arcuate surface.

Figure 12:
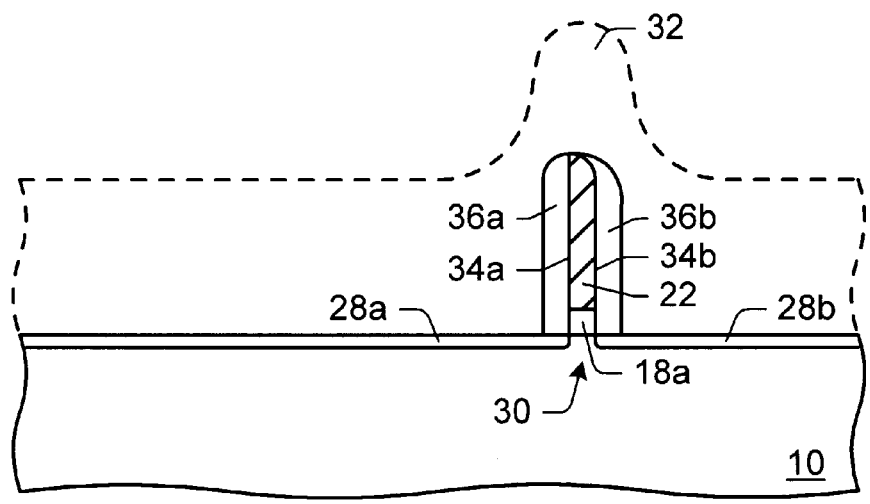
FIG. 12 is a partial cross-sectional view of the semiconductor substrate, wherein a spacer material is formed to a varying degree on lateral surfaces of the gate conductor according to a processing step subsequent to FIG. 11.

FIG. 12 depicts a material 32 deposited entirely across the exposed topography of gate conductor 22, and LDD areas 28a and 28b. Spacer material 32 then undergoes an anisotropic etch similar to that used to form gate conductors 22 according to the step shown in FIG. 6. Of important significance in the deposition of material 32 is the tendency to "fill" abrupt step edges of gate conductor 22. This means that spacer material 32 not only is conformal but also, to some degree, attempts to planarize the opposing lateral surfaces of gate conductor 22. The substantially planar surface is shown as reference numeral 34a, while the arcuate surface is shown as reference numeral 34b. The perpendicular, abrupt step afforded by surface 34a provides a greater propensity to planarize that surface by material 32, leaving an asymmetrical deposition characteristic. More importantly, when an anisotropic etch is applied, material 32 from surface 34a is removed at a lesser rate than material 32 from surface 34b. This is due to anisotropic etch removing substantially horizontal surfaces faster than vertical surfaces. The more perpendicular (vertical) surface 34a will be retained to a greater extent than surface 34b. This is demonstrated in the greater thickness of resulting spacer 36a than spacer 36b.

Figure 13:
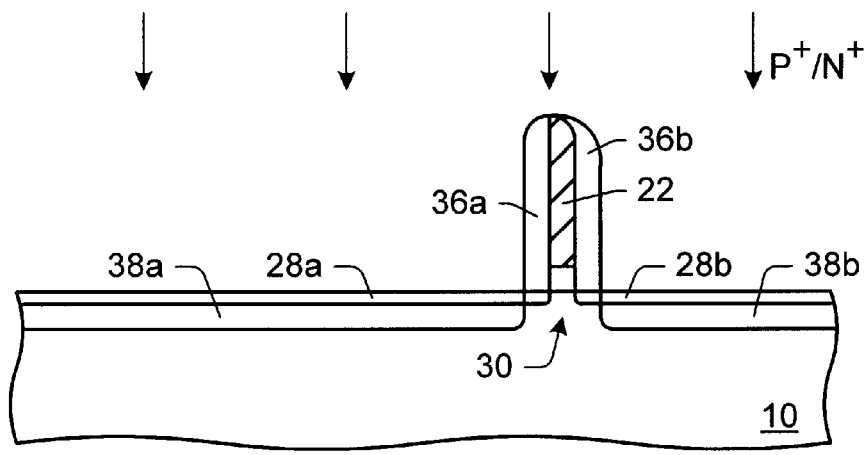
FIG. 13 is a partial cross-sectional view of the semiconductor substrate, wherein a source/drain implant is forwarded into the semiconductor substrate a spaced distance from the gate conductor according to a processing step subsequent to FIG. 12.

The benefits of having asymmetrical spacers 36a and 36b is illustrated in reference to FIG. 13. During source/drain implants, gate conductor 22, spacers 36a and 36b serve to mask the implants from substrate 10. Importantly, spacer 36a will draw the drain junction area 38a further from channel 30 than will spacer 36b draw source 38b from channel 30. The source/drain implants are of the same species type as the LDD implants; however, they are of greater concentration and are implanted to a greater depth than the LDD implants. For an NMOS device, the LDD and source/drain implants are n-type whereas a PMOS device uses p-type LDD and source/drain implants. It is understood that both p- and n-type implant species can be used to form an integrated circuit having PMOS, NMOS or both PMOS and NMOS transistors on the same monolithic substrate.

Figure 14:
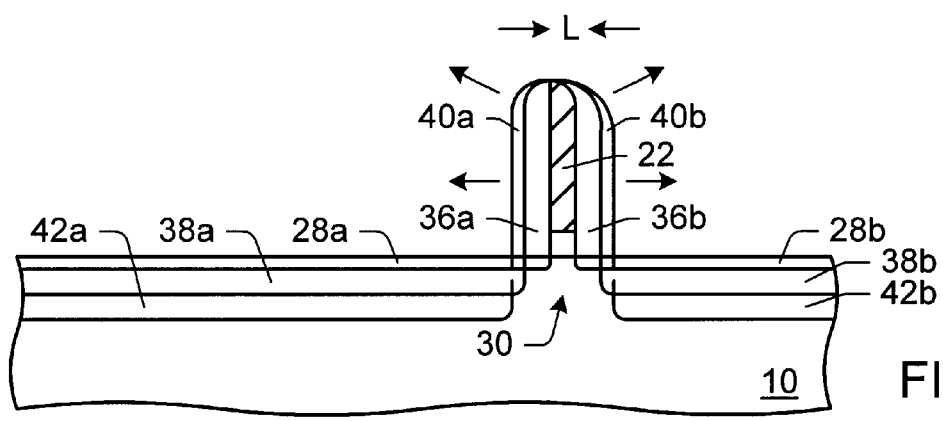
FIG. 14 is a partial cross-sectional view of the semiconductor substrate, wherein additional spacer material of dissimilar thicknesses are formed on the initial spacers of the gate conductor lateral surfaces to produce asymmetric source/drain implant areas according to a processing step subsequent to FIG. 13.

FIG. 14 depicts additional spacers 40a and 40b produced on the drain-side and source-side of the pre-existing spacers 36. After source/drain implants 38 are in place, additional spacers 40 are produced similar to the way in which spacers 36 are formed. Once additional spacers 40 are formed, additional source, drain implants 42a and 42b can be produced. It is important to note that the use of additional spacers can be continued to achieve multiple, layered spacers, beyond the two spacers shown. After each spacer is formed, an implant is inserted into substrate 10. The accumulation of spacers and implants causes what is henceforth referred to as a graded junction, comprising LDD areas and multiple source/drain areas opposite channel 30. The graded junctions, and the asymmetrical characteristics of drains being drawn further from channel 30, relative to sources provides the benefit of dispersing Em at the critical drain-side while minimizing parasitic resistance at the source-side. The use of multiple spacers and multiple source/drain implants therefore achieves optimal source/drain design when employing channel lengths L less than, for example, 1.0 $\mu$m. As channel lengths decrease, (i.e., as Leff decrease) it is important to properly design one or more spacers with interspersed and gradually increasing dopant concentrations and depths. It is also important to utilize an asymmetrical spacer configuration for the benefit of reducing HCE associated with SCE-type structures but without source-side parasitic resistance problems.

Figure 15:
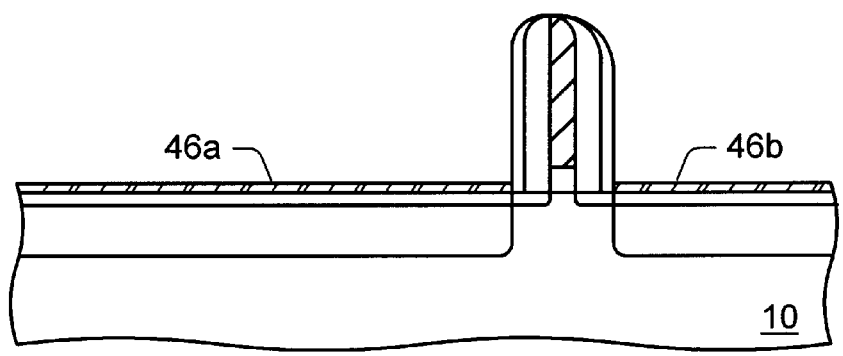
FIG. 15 is a partial cross-sectional view of the semiconductor substrate, wherein a silicide is formed on exposed silicon regions of the junctions according to a processing step subsequent to FIG. 14.

FIG. 15 depicts a processing step subsequent to FIG. 14, wherein a silicide 46a and 46b are formed over the source/drain areas. Silicide 46 forms only upon and within silicon-based surfaces and not on or within oxide based surfaces. Accordingly, spacers 36 and 40 are oxide based. To form a silicide, a refractory metal is deposited across the entire exposed surfaces. The metal undergoes a two-step anneal process. The first anneal cycle causes a first phase reaction. All non-reacted metal is removed except for in regions where silicon atoms are prevalent. Thus, the second anneal step causes a second phase reaction of refractory metal only on the silicon-based junctions. Silicide 46 serves to enhance ohmic conductivity of subsequent metalization layers drawn to the junctions For sake of brevity, and clarity of the drawings, the subsequent metalization layers are not shown. However, it is understood that an integrated circuit which utilizes the present process will have subsequent fabrication steps involving interlevel dielectrics and one or more layers of metalization.

Figure 16:
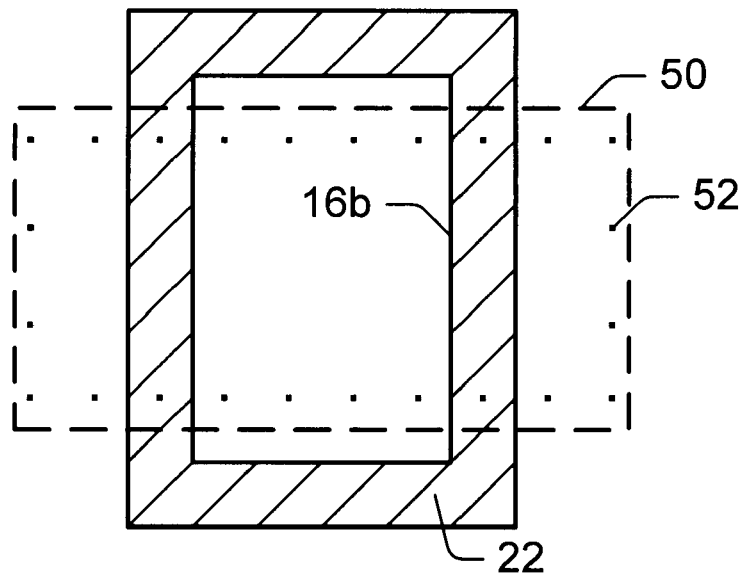
FIG. 16 is a top plan view of the patterned sacrificial material with gate conductors formed about sidewall surfaces of the sacrificial material.

Turning now to FIG. 16, a top plan view is shown of sacrificial material 16b patterned according to a process step shown in FIG. 2. Subsequent to formation of material 16b is the formation of gate conductors 22 about the sidewall surfaces 24 of sacrificial material 16b. It is understood that the cross-sectional plane of the previous drawings may be illustrative of a cross-sectional of FIG. 16. Thus, opposing surfaces of sacrificial material 16b have gate conductors 22 formed thereon. As shown in FIG. 16, two sets of opposing surfaces are drawn.

Sacrificial material 16b is shown in one example as a square or rectangle. However, it is understood that the shape can vary considerably depending upon where gate conductors are to be located. In the example shown, gate conductor 22 extends as a contiguous material around the entire sidewall surfaces of material 16b. A masking material 50 is patterned to cover an active area 52. The active area comprises a portion of substrate 10 between isolation (or field) areas. The active area is defined as the area where active and passive devices are to be formed.

Figure 17:
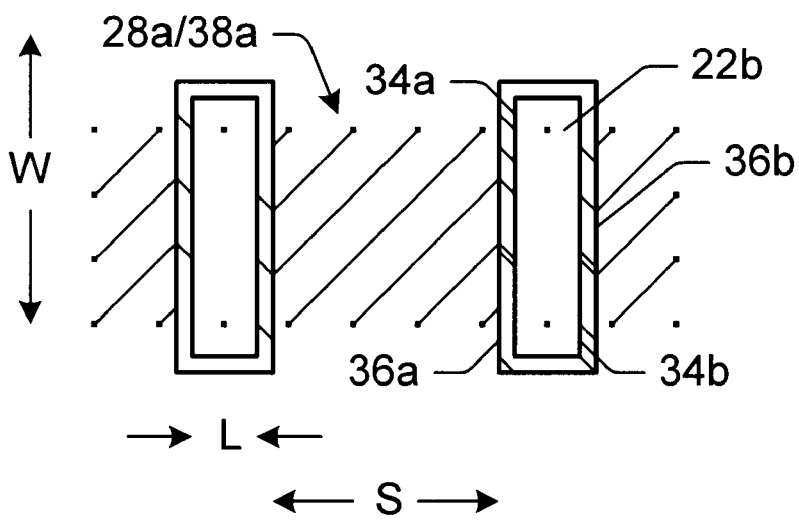
FIG. 17 is a top plan view of portions of the gate conductors and the entire sacrificial material removed prior to forming spacers about the retained gate conductors according to a processing step subsequent to FIG. 16.

FIG. 17 depicts a processing step subsequent to FIG. 16, whereby mask 50 allows portions of gate conductor 22 outside of mask 50 to be exposed. Those exposed portions can then be removed using various etch techniques, leaving retained gate conductors 22b. Opposing lateral surfaces 34a and 34b of each retained gate conductor 22b provides lateral surfaces on which spacers 36a and 36b are formed. Prior to formation of spacers 36, however, LDD implants 28 are forwarded into substrate 10. After spacers 36 are formed, source/drain implants 38 are forwarded into substrate 10. A contiguous implant area 28a and 38a can thereby be formed from one gate conductor to another gate conductor as shown. The contiguous area can be fairly small so that spacing between gate conductors is quite dense. The amount of contiguous area is controlled by the size of sacrificial material 16b. By scaling the patterned sacrificial material 16b downward, series-connection of a pair of transistors can be made quite dense. Further, by reducing the size of mask 50 (shown in FIG. 16) the gate width W can also be made quite small. Thus, the present process methodology is readily adapted to high density integrate circuit fabrication having, for example, gate lengths L less than 0.1 $\mu$m and gate widths which vary, but can be made as large or as small as needed.

It will be appreciated to those skilled in the art having the benefit of this disclosure that this invention is believed to be capable of forming NMOS and/or PMOS transistors of small gate lengths and which derive a benefit in having an asymmetrical spacers and both asymmetrical and graded implant areas. Furthermore, it is also to be understood that the form of the invention shown and described is to be taken as exemplary, presently preferred embodiments. Various modifications and changes may be made to each and every processing step without departing from the spirit and the scope of the invention as set forth in the claims. It is intended that the following claims be interpreted to embrace all such modifications and changes and, accordingly, the specification and drawings are being regarded in an illustrative rather than a restrictive sense.

What is claimed is:

1. A method for forming a transistor, comprising:

patterning a sacrificial material having opposed sidewall surfaces upon a dielectric-covered semiconductor substrate;

forming a gate conductor upon only said sidewall surfaces;

removing a portion of said gate conductor and said sacrificial material;

depositing dopants of a first concentration immediately adjacent said gate conductor to form lightly doped drain areas within said semiconductor substrate;

forming a first spacer comprising a first thickness and a second spacer comprising a second thickness greater than said first thickness on opposed lateral surfaces of said gate conductor, wherein said first spacer is formed adjacent an arcuate surface of said gate conductor and wherein said second spacer is formed adjacent a planar surface of said gate conductor;

depositing dopants of a second concentration greater than the first concentration spaced from said gate conductor by said first spacer and said second spacer to form a source area and a drain area, respectively, within said semiconductor substrate;

forming a third spacer and a fourth spacer adjacent said first and second spacers, respectively, wherein a thickness of said third spacer is less than a thickness of said fourth spacer; and depositing dopants of a third concentration spaced from said gate conductor by said third spacer and said fourth spacer to form second source and drain areas, respectively, within said semiconductor substrate; and forming transistor interconnect regions upon the source and drain areas.

2. The method as recited in claim 1, wherein said forming a gate conductor comprises depositing a polycrystalline material upon the gate conductor and thereafter removing the polycrystalline material except in regions immediately adjacent said sidewall surfaces.

3. The method as recited in claim 1, further comprising, after said patterning and before said forming said gate conductor, removing dielectric from said dielectric-covered semiconductor substrate immediately adjacent said sacrificial material and thereafter growing an oxide in the regions removed of said dielectric.

4. The method as recited in claim 1, wherein said removing comprises selectively removing the portion of said gate conductor prior to removing said sacrificial material.

5. The method as recited in claim 1, wherein said removing comprises lithography removing a defined length within a contiguous, laterally extending run of said gate conductor.

6. The method as recited in claim 1, wherein depositing dopants of said first and said second concentrations comprises implanting n-type species into said semiconductor substrate.

7. The method as recited in claim 1, wherein depositing dopants of said first and said second concentrations comprises implanting p-type species into said semiconductor substrate.

8. The method as recited in claim 1 wherein removing a portion of said gate conductor and said sacrificial material comprises:

depositing a photoresist across said sacrificial material and said gate conductor;

patterning said photoresist to expose a portion of said sacrificial material and to expose said gate conductor laterally adjacent said portion of said sacrificial material;

etching said exposed gate conductor;

removing said photoresist; and etching said sacrificial material.

* * * * *